US011343916B2

(12) United States Patent
Tuominen

(10) Patent No.: US 11,343,916 B2
(45) Date of Patent: May 24, 2022

(54) COMPONENT CARRIER AND METHOD OF MANUFACTURING THE SAME

(71) Applicant: AT&S (China) Co. Ltd., Shanghai (CN)

(72) Inventor: Mikael Tuominen, Pernio (FI)

(73) Assignee: AT&S(China) Co. Ltd., Shanghai (CN)

( * ) Notice: Subject to any disclaimer, the term of this patent is extended or adjusted under 35 U.S.C. 154(b) by 0 days.

(21) Appl. No.: 17/247,174

(22) Filed: Dec. 2, 2020

(65) Prior Publication Data

US 2021/0185816 A1 Jun. 17, 2021

(30) Foreign Application Priority Data

Dec. 12, 2019 (CN) .................. 201911272714.7

(51) Int. Cl.
*H05K 1/18* (2006.01)
*H05K 1/16* (2006.01)
(Continued)

(52) U.S. Cl.
CPC ............. *H05K 1/16* (2013.01); *H05K 1/0298* (2013.01); *H05K 1/056* (2013.01); *H05K 1/111* (2013.01);
(Continued)

(58) Field of Classification Search
CPC ........ H05K 1/16; H05K 1/0298; H05K 1/056; H05K 1/111; H05K 2201/0154; H05K 2201/0358; H05K 3/4602; H05K 2201/10674; H05K 1/188; H05K 1/182; H05K 1/183; H05K 1/184; H05K 1/185; H01L 21/568; H01L 23/3121; H01L 24/03; H01L 24/05; H01L 23/5389; H01L 23/12; H01L 23/142; H01L 21/4846
See application file for complete search history.

(56) References Cited

U.S. PATENT DOCUMENTS 5,773,359 A * 6/1998 Mitchell ................. H01L 24/05
438/614
5,868,949 A * 2/1999 Sotokawa ............... H05K 1/112
216/18
(Continued)

FOREIGN PATENT DOCUMENTS

CN 104681520 A 6/2015
CN 108231601 A 6/2018
(Continued)

OTHER PUBLICATIONS

EXCELLO circuits, Glossary of Terms, Aug. 12, 2015 (Year: 2015).*
(Continued)

*Primary Examiner* — Steven T Sawyer
(74) *Attorney, Agent, or Firm* — Robert A. Blaha; Smith Tempel Blaha LLC

(57) ABSTRACT

A component carrier has a stack including at least one electrically conductive layer structure and/or at least one electrically insulating layer structure. A component is embedded in the stack. The component includes a redistribution structure with at least one vertically protruding electrically conductive pad, and an electrically conductive material on at least part of said at least one pad. A method of manufacturing a component carrier is also disclosed.

19 Claims, 2 Drawing Sheets

(51) Int. Cl.
  *H05K 1/02* (2006.01)
  *H05K 1/05* (2006.01)
  *H05K 1/11* (2006.01)
(52) U.S. Cl.
  CPC ............ *H05K 1/182* (2013.01); *H05K 1/185* (2013.01); *H05K 2201/0154* (2013.01); *H05K 2201/0358* (2013.01)

(56) References Cited

U.S. PATENT DOCUMENTS

| | | | |
|---|---|---|---|
| 10,079,156 B2 | 9/2018 | Lee et al. | |
| 2007/0040272 A1 | 2/2007 | Sheats | |
| 2007/0227765 A1* | 10/2007 | Sakamoto | H01L 24/19 174/260 |
| 2009/0205202 A1* | 8/2009 | Tanaka | H05K 1/188 29/834 |
| 2009/0218118 A1 | 9/2009 | Tani | |
| 2010/0078205 A1* | 4/2010 | Sakai | H01L 24/24 156/247 |
| 2013/0037929 A1 | 2/2013 | Appelt et al. | |
| 2013/0284509 A1* | 10/2013 | Murayama | H01L 23/49811 174/267 |
| 2016/0133562 A1 | 5/2016 | Lee et al. | |
| 2016/0284657 A1 | 9/2016 | Cho et al. | |
| 2016/0338202 A1 | 11/2016 | Park et al. | |
| 2017/0250162 A1* | 8/2017 | Soga | H01L 24/13 |
| 2017/0373011 A1* | 12/2017 | Gowda | H01L 23/5389 |
| 2018/0254216 A1 | 9/2018 | Olson et al. | |
| 2019/0006289 A1 | 1/2019 | Huang et al. | |

FOREIGN PATENT DOCUMENTS

| | | |
|---|---|---|
| CN | 108307591 A | 7/2018 |
| CN | 109640521 A | 4/2019 |
| CN | 109712894 A | 5/2019 |
| EP | 3 273 467 A2 | 1/2018 |
| EP | 2502268 B1 | 10/2018 |
| EP | 3 557 608 A1 | 10/2019 |

OTHER PUBLICATIONS

Office Action in Patent Application No. 201911272714.7; dated Oct. 20, 2020, China National Intellectual Property Administration, No. 6, Xitucheng Lu, Jimenqiao Haidian District, Beijing City, 100088, China.

Kästner, M.; Extended European Search Report in Application No. 20 211 200.9; pp. 1-9; dated May 12, 2021, European Patent Office, 80298, Munich, Germany.

* cited by examiner

COMPONENT CARRIER AND METHOD OF MANUFACTURING THE SAME

CROSS-REFERENCE TO RELATED APPLICATIONS

This application claims the benefit of the filing date of the Chinese Patent Application No. 201911272714.7, filed Dec. 12, 2019, the disclosure of which is hereby incorporated herein by reference.

TECHNICAL FIELD

The invention relates to a method of manufacturing a component carrier and to a component carrier.

BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. At the same time, component carriers shall be mechanically robust and electrically reliable so as to be operable even under harsh conditions.

In particular, embedding a component in a component carrier with reasonable manufacturing effort and with a proper electric connection is an issue.

SUMMARY

There may be a need to embed a component in a component carrier in a simple way and with proper electric reliability.

According to an exemplary embodiment of the disclosure, a component carrier is provided which comprises a stack (for instance a laminated stack) comprising at least one electrically conductive layer structure (in particular a plurality of electrically conductive layer structures) and/or at least one electrically insulating layer structure (in particular a plurality of electrically insulating layer structures, for instance comprising a core), a component (or a plurality of components) embedded in the stack, wherein the component comprises a redistribution structure (in particular a redistribution layer) with at least one (in particular downwardly) vertically protruding electrically conductive pad (in particular a plurality of pads), and electrically conductive material on (in particular directly on) at least part of said at least one pad.

According to another exemplary embodiment of the disclosure, a method of manufacturing a component carrier is provided, wherein the method comprises providing a stack comprising at least one electrically conductive layer structure and/or at least one electrically insulating layer structure, embedding a component in the stack, providing the component with a redistribution structure with at least one vertically protruding electrically conductive pad, and forming electrically conductive material on at least part of said at least one pad.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component" may particularly denote any inlay to be integrated in a cavity of a component carrier stack. Said inlay may fulfill an electric function and may be connected to one more electrically conductive layer structures of the stack via its one or more pads.

In the context of the present application, the term "stack" may particularly denote an arrangement of multiple planar layer structures which may be mounted in parallel on top of one another.

In the context of the present application, the term "layer structure" may particularly denote a continuous layer, a patterned layer or a plurality of non-consecutive islands within a common plane.

In the context of the present application, the term "redistribution structure" may particularly denote an array of interconnected electrically conductive elements in an optional dielectric matrix which may be configured to translate between relatively small dimensions of structures of a respective component (such as pad dimensions and/or distances of a semiconductor component) and larger dimensions of structures of component carrier technology (such as the dimension of exterior lands and traces of a printed circuit board (PCB)). A redistribution structure may also be denoted as a circuitry transferring a first spatial spacing (in particular a narrower spacing) of input/output contacts (in particular at a position of an embedded component such as a semiconductor chip) into a different second spatial spacing (in particular a wider spacing) of input/output contacts (in particular at an external position of a component carrier such as a printed circuit board). In other words, an electric fan-out function may be provided by a redistribution structure. When a redistribution structure has a substantially planar layer shape, it may also be denoted as a redistribution layer.

According to an exemplary embodiment of the disclosure, an elevated or protruding electrically conductive pad of a redistribution layer (preferably with dielectric material, the latter being retracted with respect to the at least one protruding pad) may be provided on a component to be embedded in a stack of a component carrier (such as a printed circuit board, PCB). One or more spaces around the at least one vertically protruding pad may then be filled during embedding the component in the stack with a laminate resin or an adhesive forming an underfill without additional manufacturing effort. Advantageously, such an underfill may then be covered, together with exposed surfaces of the protruding pad(s), with additional electrically conductive material in a very simple way, in particular without specific pretreatment. On such an underfill material, it may be in particular possible to carry out a standard electroless plating procedure for creating the additional electrically conductive material with proper adhesion. In particular, depositing electrically conductive material on the at least one pad and said underfill may be performed without the need of carrying out a cumbersome sputtering process. Such a sputtering process may be conventionally needed for covering pad-aligned dielectric material of a redistribution structure of a component to be embedded, since electroless plated electrically conductive material usually shows a poor adhesion or even no adhesion at all on typical dielectric materials of redistribution structures of components.

According to an exemplary embodiment of the disclosure, a component carrier with embedded component may thus be provided which component has a redistribution structure with a protruding pad protruding vertically (in particular beyond a dielectric material of the redistribution structure). By taking this measure, embedding the component in an opening of a stack may be carried out in such a way that the end surface of the pad substantially flushes with an end surface of the stack, for instance so that the end surface of the dielectric material may be retracted with respect to the end surface of stack and pad. As a consequence, a filling procedure of filling gaps between stack and component with an adhesive electrically insulating material (preferably by lamination) may result in an at least partial filling of gaps delimited by adjacent pads and the end surface of the dielectric material. As a consequence, the lower main surface of an obtained structure may not be delimited by dielectric material of the redistribution structure but in contrast to this by material of the at least one pad (or another electrically conductive material other than the material of the pad) and the adhesive electrically insulating material, i.e. said underfill. Electrically conductive material may then be deposited on the exposed surfaces of the pad(s) and on electrically insulating adhesive material filling said gaps during lamination. As a result, it may be possible to deposit the electrically conductive material by electroless plating or the like, so that a more complex sputtering process for depositing electrically conductive material on typical dielectric materials (in particular polyimide) of a redistribution structure of a component to be embedded may be omitted. This may significantly simplify the manufacturing process. Moreover, the described manufacturing process may result in a component carrier having improved stability and a high electric reliability at small dimensions. Highly advantageously, sputtering may be made dispensable.

In the following, further exemplary embodiments of the method and the component carrier will be explained.

In a preferred embodiment, the at least one electrically conductive pad vertically may protrude beyond an end surface of dielectric material of the redistribution structure. Correspondingly, the method may comprise providing the at least one electrically conductive pad so as to vertically protrude beyond an end surface of dielectric material of the redistribution structure. As described above, a pad which may vertically protrude beyond dielectric material of the redistribution structure of the component to be embedded may allow to carry out the manufacturing method with low effort.

The mentioned dielectric material may be a component redistribution layer dielectric, such as polyimide or polybenzoxazole or similar. The mentioned dielectric material may cover the whole active surface of the component except one or connection terminals or pads. Connection terminals or pads may thus to be without said dielectric material. The redistribution layer may have such a dielectric or not.

In an embodiment, the dielectric material may comprise or may consist of a non-electroless plateable material or a poorly electroless plateable material, in particular polyimide or polybenzoxazole. In the context of the present application, the term "non-electroless plateable material or poorly electroless plateable material" may in particular denote a material on which standard electroless plating of copper, etc., may not work properly or may not work without taking specific cumbersome measures, since the electroless plated material may not properly adhere as such on the poorly electroless plateable or non-electroless plateable material. Polyimide may be a typical dielectric material of a redistribution structure (in particular a redistribution layer) applied to a contact or active surface of a component. Polyimide may however have the shortcoming that deposition of electrically conductive material thereon may require usually a sputtering process and may not be possible with standard electroless deposition or plating with sufficient adhesion. This need of sputtering conventionally may involve an additional effort when depositing electrically conductive material on pad and a dielectric surface of a planar redistribution structure. Since, by exemplary embodiments of the invention, the at least one pad may be provided protruding beyond the end surface of the dielectric material of the redistribution structure, it may be possible to make the dielectric material of the redistribution structure of polyimide without the need of a complex sputtering deposition of electrically conductive material. When the gaps between the polyimide and the one or more pads are filled with an underfill such as a laminate resin, electrically conductive material may be plated on the underfill material by electroless deposition without adhesion issues and without the need of sputtering.

In an embodiment, the electrically conductive material may comprise or may consist of copper. When the electrically conductive material deposit-ed on the pad (and preferably also on adhesive electrically insulating material formed on the dielectric end surface during lamination or the like) is made of copper, it may be applied in a simple way by standard PCB processes.

In an embodiment, one of the at least one electrically conductive layer structure of the stack may be arranged on a bottom of the stack and may be at least partially covered by said electrically conductive material. Both said electrically conductive layer structure of the stack as well as the pads may thus be covered with said additional electrically conductive material, which may be applied for example by electroless deposition, if desired in combination with galvanic plating.

In an embodiment, the component carrier may comprise an underfill (in particular an underfilling laminate resin) on the end surface of dielectric material between adjacent pads of the electronic component. Such an underfill may be formed of the above-mentioned adhesive electrically insulating material used for laminating stack and component together. For instance, such an underfill may be formed of prepreg resin which may become flowable during the lamination and thereby may also flow into the tiny gaps delimited between the at least one pad and the end surface of the dielectric material of the redistribution structure. In contrast to polyimide material being typically used as dielectric material of the redistribution structure, such an epoxy resin underfill may be able to be covered with properly adhering copper material during electroless deposition. Thus, providing such an underfill may make it possible to apply the electrically conductive material by electroless deposition rather than by sputtering.

In an embodiment, material of the underfill may also surround at least part of sidewalls and/or at least part of an upper main surface of the embedded component for mechanically connecting the component with the stack. Thus, the material of the underfill may not only fill gaps between the pad(s) and the end surface of the dielectric redistribution layer material, but additionally may contribute to gluing the embedded component in place in a cavity of the stack. For instance, the material of the underfill which may also at least partially surround the embedded component in the stack may be a liquid adhesive material which may solidify during curing. It may also be possible that said underfill material may previously be at least partially uncured resin material (for instance of a laminated prepreg sheet) which may cure during lamination and thereby may flow into one of more gaps between pad(s) and the end surface as well as in one or more gaps between the stack and the component.

In an embodiment, the at least one electrically conductive pad may vertically protrude beyond the end surface by not more than 30 µm, in particular by not more than 20 µm. By preventing excessive protrusion of the one or more pads beyond the dielectric end surface of the redistribution layer, the risk of damage during handling and lamination may be kept small. In other words, not excessively protruding pads may be less prone to undesired bending or breakage during the manufacturing process, for instance due to an applied force during assembly of the component in a cavity of the stack and during the application of mechanical pressure in terms of lamination. Limiting the length of the one or more pads to 30 µm has turned out as an advantageous trade-off between robustness and needs in terms of connectivity. Furthermore, pads of up to 30 µm vertical length may result in gaps which may be properly filled with an underfill during laminating or adhering a component in a cavity of the stack.

In an embodiment, a thickness of the at least one pad may be in a range from 4 µm to 30 µm, in particular in a range from 4 µm to 20 µm, preferably in a range from 6 µm to 12 µm. With the mentioned thicknesses, on the one hand an excessive protrusion of the at least one pad beyond the rest of the electronic component may be ensured. This may keep the vertical dimensions of the component carrier sufficiently small and may prevent the component from damage during the manufacturing process. On the other hand, such a sufficiently large thickness of the at least one pad may ensure that adhesive electrically insulating material of a laminate (such as prepreg) or of a liquid adhesive may reliably fill the gaps between dielectric material of the redistribution layer and one or more pads. Thereby, it may be ensured that the dielectric lower main surface may in fact be formed by the adhesive electrically insulating material rather than by the polyimide material of the redistribution structure.

In an embodiment, a ratio between a vertical thickness and a horizontal diameter of the at least one pad may be smaller than 0.5, in particular may be smaller than 0.2. Hence, the aspect ratio of the at least one pad may remain sufficiently small so as to prevent an excessive elongation of the pad in a vertical direction. This may keep the configuration compact and robust against damage.

In an embodiment, the additionally applied electrically conductive material may form part of a patterned metal layer. Correspondingly, the method may comprise forming the electrically conductive material as a continuous layer. It may in particular be advantageous to subsequently pattern the continuous layer to thereby form at least one land being electrically connected to the at least one pad. Thus, it may firstly be possible to apply, deposit or attach a full metal layer to the pad(s), the stack and to underfill material (such as laminate resin), and to subsequently pattern said continuous metal layer. This may be accomplished for example by lithographic etching.

In an embodiment, the electrically conductive material may be patterned to form at least one land on the at least one pad. Preferably but not necessarily, the at least one land may extend laterally beyond the at least one pad. Thus, the electrically conductive material may be initially applied as a continuous layer on the main surface of the semi-finished component carrier. Thereafter, said continuous layer may be patterned for forming one or more lands directly on the respective electrically conductive pad. When the lands laterally extend beyond the pads, i.e. provide a larger exposed surface than the pads, electrically contacting the component carrier with embedded component may be significantly simplified. Descriptively speaking, the one or more lands may enhance the fan-out function of the redistribution structure.

In an embodiment, the electrically conductive material may be applied also on an underfill (in particular an underfilling laminate resin) on the end surface of the dielectric material between adjacent pads. Highly advantageously, the electrically conductive material may be applied with a deposition procedure during which it may not only attach to the material of the at least one pad (in particular copper), but preferably also on the underfill material of the adhesive electrically insulating material applied during lamination based or adhesion-based embedding of the component. In such an event it may be advantageously also possible that, by patterning the continuous layer of electrically conductive material, lands with increased diameter as compared to the diameter of the pad may be produced.

In an embodiment, the method may comprise applying the electrically conductive material by electroless plating or deposition, optionally followed by galvanic plating, rather than by sputtering. In the context of the present application, the term "electroless deposition" or "electroless plating" may particularly denote a non-galvanic plating method that may involve several simultaneous reactions in an aqueous solution, which may occur without the use of external electrical power. It may be mainly different from electroplating by not using external electrical power. In the context of the present application, the term "galvanic plating" or electroplating may particularly denote a process of depositing electrically conductive material in which an ionic metal may be supplied with electrons to form a non-ionic coating on a substrate. A corresponding system may involve a chemical solution with the ionic form of the metal, an anode (positively charged) which may consist of the metal being plated (a soluble anode) or an insoluble anode (usually carbon, platinum, titanium, lead, or steel), and finally, a cathode (negatively charged) where electrons may be supplied to produce a film of non-ionic metal. Descriptively speaking, electroless deposition may be used to form a base layer of the electrically conductive material on the at least one pad and preferably also on said underfill material. If desired, the base layer may be thickened by a subsequent galvanic plating procedure. This method of forming the electrically conductive material may be simple and straightforward and may make a more complex sputtering process dispensable. However, such a sputtering process may be alternatively possible in other embodiments.

In an embodiment, the method may comprise embedding the component in a through-hole extending through the stack. In such an embodiment, a component accommodation volume may extend through the entire stack. For inserting the component in the through hole, a bottom of the through hole may be temporarily closed by a temporary carrier such as an adhesive tape. The temporary carrier may provide temporary mechanical support for the component(s) before the arrangement of stack and component(s) becomes rigid by a lamination or a gluing procedure. After the laminating or gluing, the temporary carrier may then be removed, since the arrangement of stack, component and laminated dielectric material or glue may now be sufficiently rigid that the support function of the temporary carrier may be no longer needed. Additionally or alternatively to lamination, it may also be possible to at least partially fill the at least one cavity with a filling medium (in particular an adhesive material or glue) before or after placing the component in the cavity or through hole of the stack. For instance, the filling medium may be filled in the cavity by dispensing, an ink-jet procedure, etc.

For instance, such a temporary carrier may be a sticky tape which may be attached to the back side of the stack and which may close a through-hole in the stack for delimiting a respective cavity for the component. The component may then be placed on the sticky surface of the temporary carrier so as to ensure a correct positioning of the component. After having attached and connected (in particular by lamination) the electrically insulating layer structure to the stack and the component while simultaneously filling the gaps in between with material of the electrically insulating layer structure to thereby obtain a rigid structure, the temporary carrier may be no longer needed and can be removed from the back side. Thus, it may be possible that the temporary carrier may not form part of the readily manufactured component carrier. Nevertheless, the temporary carrier may contribute to the spatially accurate positioning of the component in the stack. Such an accurate positioning may be in particular highly advantageous when the component is provided with a redistribution structure with vertically protruding pad(s), since the lamination or filling process of the gaps may reliably cover dielectric end surfaces of the redistribution structure.

In an embodiment, the method may comprise providing the component with a preform of the redistribution structure having a preform of the at least one electrically conductive pad. In said preform of the redistribution structure, it may be possible that the preform of the at least one pad flushes or may be aligned with (i.e. not yet protrudes beyond) the end surface of the dielectric material. Subsequently, it may be possible to selectively thicken the preform of the at least one electrically conductive pad so as to protrude beyond the end surface. This selective thickening may be done by plating additional metal on the preform of the at least one pad until the obtained at least one pad protrudes beyond the dielectric end surface to a desired extent.

In an embodiment, the component carrier may comprise a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In an embodiment, the component carrier may be shaped as a plate. This may contribute to the compact design, wherein the component carrier nevertheless may provide a large basis for mounting components thereon. Furthermore, in particular a naked die as example for an embedded electronic component, may be conveniently embedded, thanks to its small thickness, into a thin plate such as a printed circuit board.

In an embodiment, the component carrier may be configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which may be formed by laminating several electrically conductive layer structures with several electrically insulating layer structures, for instance by applying pressure and/or thermal energy. As preferred materials for PCB technology, the electrically conductive layer structures may be made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board may usually be configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate may be understood as a carrier for electrical connections or electrical networks as well as component carrier comparable to a printed circuit board (PCB), however with a considerably higher density of laterally and/or vertically arranged connections. Lateral connections may be for example conductive paths, whereas vertical connections may be for example drill holes. These lateral and/or vertical connections may be arranged within the substrate and may be used to provide electrical and/or mechanical connections of housed components or unhoused components (such as bare dies), particularly of IC chips, with a printed circuit board or intermediate printed circuit board. Thus, the term "substrate" may also include "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based build-up films or polymer compounds like polyimide, polybenzoxazole, or benzocyclobutene-functionalized polymers.

In an embodiment, the at least one electrically insulating layer structure may comprise at least one of the group consisting of resin (such as reinforced or non-reinforced resins, for instance epoxy resin or Bismaleimide-Triazine resin, more specifically FR-4 or FR-5), cyanate ester resins, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg (such as FR4), or epoxy-based build-up film or photo-imageable dielectrics may usually be preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure may comprise at least one of the group consisting of copper, aluminum, nickel, silver, gold, palladium, and tungsten. Although copper may usually be preferred, other materials or coated versions thereof may be possible as well, in particular coated with supra-conductive material such as graphene.

In an embodiment, the component may be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component may be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element may be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the stack and/or may be embedded in an interior thereof.

In an embodiment, the component carrier may be a laminate-type component carrier. In such an embodiment, the component carrier may be a compound of multiple layer structures which may be stacked and connected together by applying a pressing force and/or heat.

After processing interior layer structures of the component carrier, it may be possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers may be obtained.

After having completed formation of a stack of electrically insulating layer structures and electrically conductive layer structures, it may be possible to proceed with a surface treatment of the obtained layers structures or component carrier.

In particular, an electrically insulating solder resist may be applied to one or both opposing main surfaces of the layer stack or component carrier in terms of surface treatment. For instance, it may be possible to form such as solder resist on an entire main surface and to subsequently pattern the layer of solder resist so as to expose one or more electrically conductive surface portions which may be used for electrically coupling the component carrier to an electronic periphery. The surface portions of the component carrier remaining covered with solder resist may be efficiently protected against oxidation or corrosion, in particular surface portions containing copper.

It may also be possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish may have the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the disclosure are apparent from the examples of embodiment to be described hereinafter and are explained with reference to these examples of embodiment.

DETAILED DESCRIPTION OF EXEMPLARY EMBODIMENTS

Figure 1:
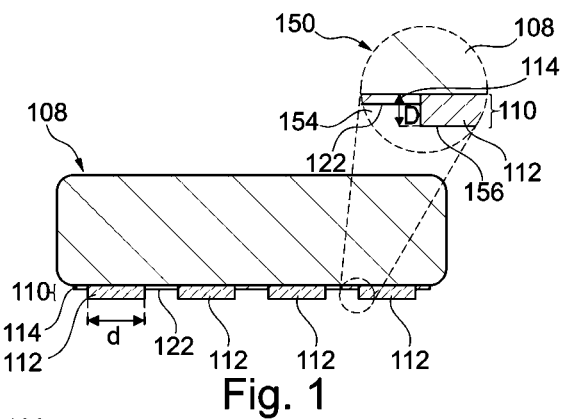
FIG. 1, FIG. 2, FIG. 3, FIG. 4 and FIG. 5 illustrate cross-sectional views of structures obtained during carrying out a method of manufacturing a component carrier with embedded component, shown in FIG. 5, according to an exemplary embodiment of the disclosure.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the disclosure have been developed.

According to an exemplary embodiment of the disclosure, a component carrier with layer stack and embedded component may be provided, wherein the component may have a redistribution layer with an electrically conductive pad protruding beyond the rest of the redistribution layer, preferably by not more than 30 µm. Therefore, the pads may slightly protrude beyond the rest of the redistribution structure so as to ensure that they may not be prone to bending or breakage during an assembly process. At the same time, the protruding one or more pads may define spaces between dielectric redistribution structure material (for instance polyimide) and a lower main surface of the component carrier under production. Such gaps may be filled partially or entirely during lamination or adhesion of the component within the stack.

Conventionally, components may be provided with planar redistribution layer, i.e. without pads protruding beyond dielectric material of the redistribution layer. During lamination or adhering the component within the stack, no adhesive or resin material thus flows onto dielectric end surfaces of the redistribution layer, since those may be covered at this manufacturing stage by a temporary carrier such as an adhesive tape. As a result, after removal of the temporary carrier, the lower main surface of the obtained semi-finished component carrier may be partially defined by the dielectric material of the redistribution layer. Since such a material may not be able to be covered with electrically conductive material such as copper with a standard electroless deposition process in view of poor adhesion, it may conventionally be necessary to apply such electrically conductive material by a complex sputtering process. This may involve a significant effort.

In order to overcome the above-mentioned shortcomings, an exemplary embodiment of the invention may provide a component carrier with redistribution structure having one or more pads protruding beyond dielectric material of the redistribution structure. As a result, one or more spaces may remain between the at least one pad and the dielectric material of the redistribution structure. Such spaces may be filled with resin of a laminate (for instance prepreg) or by an electrically insulating filling adhesive used for gluing the component in the stack in place. On such a laminate or adhesive resin, it may be possible to deposit electrically conductive material such as copper by electroless deposition without the need of sputtering. This may significantly simplify the manufacturing process.

According to an exemplary embodiment, component embedding may be accomplished with elevated contact terminal design of the component to be embedded. With such an architecture, a component contact laser via may be advantageously omitted. This may allow carrying out the manufacturing process with low effort and proper current carrying capability. More specifically, an exemplary embodiment of the invention may relate to an embedded-component-PCB (printed circuit board) and a corresponding manufacturing method which may advantageously involve sufficiently elevating electronic component's terminal(s) (for instance by minimum of 5 µm) beyond a planar dielectric surface of a redistribution structure formed on said component. Such a slight elevation of the component pad(s) or terminal(s) may be enough to realize a direct plating on the terminals and to avoid the significantly higher effort of a Ti or W—Ti sputtering process.

Generally, it may be critical to ensure high enough elevation on redistribution layer (RDL) pads that may have to be exposed in a manner that a resin flow beneath the component, during lamination, may be ensured by leaving a large enough gap. An exemplary embodiment of the invention however may allow to manufacture a component carrier with embedded component with significantly reduced effort and processing complexity, as well as with an improved processing stability. Thus, it may be possible to reduce the manufacturing effort in comparison with a manufacturing process utilizing titanium sputtering on a polyimide layer without adding further complexity.

Referring to FIG. 1, the component 108, for instance embodied as a semiconductor chip, may be provided with a redistribution structure 110 on its bottom side. The substantially planar redistribution structure 110 may be provided at an exposed lower main surface thereof with a plurality of electrically conductive pads 112 which may vertically protrude in a downward direction beyond a lower end surface 122 of dielectric material 114 of the redistribution structure 110. In the shown embodiment, four pads 112 may be provided at the face-down oriented component 108. However, any other number of pads 112 may be possible as well.

Alternatively, the component 108 may also have face-up pads (not shown). In this case, a direct full back side contact with a potential copper layer may be advantageous for heat management purposes.

Further alternatively, the component 108 may also have pads 112 on both opposing main surfaces thereof (not shown). Preferably, the pads 112 may protrude beyond the dielectric end surface 122 by not more than 30 µm. As shown in a detail 150, a total thickness D of the at least one pad 112 may be preferably in a range from 6 µm to 12 µm. An aspect ratio, i.e. a ratio between vertical thickness D and a horizontal diameter d of the respective pad 112 may be preferably smaller than 0.2. The dielectric material 114 may comprise or consist of polyimide. The pads 112 may be made of copper.

As can be taken from FIG. 1, the component 108 may be manufactured with thick copper pads 112 on redistribution structure 110 without polyimide coverage on free end faces 156 of the pads 112. In other words, the redistribution layer or structure 110 may comprise dielectric material 114 (in particular made of polyimide) and pads 112 (in particular made of copper) extending downwardly beyond the dielectric end surface 122 of the dielectric material 114. As can be seen in detail 150, one or more gaps 154 may be formed between free end faces 156 of the respective pads 112 and end surface 122 of the dielectric material 114. Therefore, the pads 112 may protrude beyond the end surface 122 so as to form the gaps 154. At the same time, it may be prevented that the pad 112 may have a pronounced elongated post-like structure. This may simplify the manufacturing process and reduce the risk of damage.

For instance, the properties (in particular thickness) of the pads 112 may be adjusted by plating. In order to manufacture the illustrated component 108 with integrated redistribution structure 110 and downwardly protruding pads 112, it may be possible to provide the component 108 with a preform of the redistribution structure 110 having a preform of the pads 112, in which preform the pads 112 may be flush or may be aligned with the end surface 122 of the dielectric material 114 (not shown). Subsequently, the preform of the pads 112 may be selectively thickened by depositing additional metal on the preforms of the pads 112 until the pads 112 may protrude beyond the end surface 122 to a desired extent. As a consequence of this manufacturing process, each protruding pad 112 may be a double layer pad or even a multilayer pad with at least three layers of metallic material. Each pad layer may be made of the same material (preferably copper), or different pad layers may be made of different materials. It may be alternatively also possible that the pads 112 are single layer pads.

Figure 2:
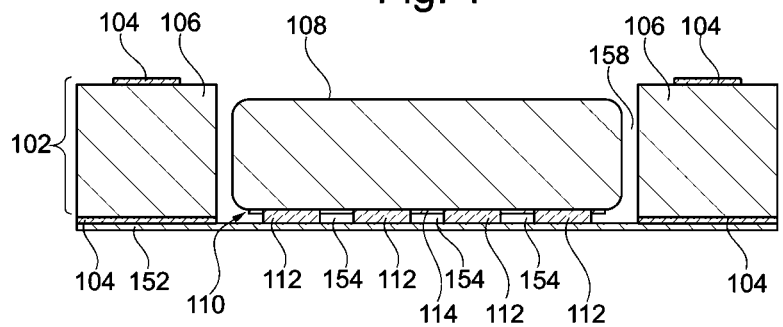

Now referring to FIG. 2, the component 108 may be placed in a cavity 158 formed in a layer stack 102.

Stack 102 may be a plate shaped laminate type layer stack composed of a plurality of electrically conductive layer structures 104 and a plurality of electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin) and optionally reinforcing particles therein (for instance glass fibers or glass spheres). For instance, the electrically insulating layer structures 106 may be made of FR4 or ABF. In the shown embodiment, the thick central electrically insulating layer structure 106 may be a fully cured core.

The cavity 158 may be defined by a through-hole in the stack 102 which may be closed on a bottom side by attaching a temporary carrier 152 to a lower main surface of the stack 102. The temporary carrier 152 may for instance be a sticky tape. By attaching the component 108 with the downwardly protruding pads 112 with direct physical contact on the temporary carrier 152 in the cavity 158, the structure shown in FIG. 2 may be obtained. The function of the temporary carrier 152 may be to provide stability as long as the component 108 may not yet be glued in place within the cavity 158.

Figure 3:
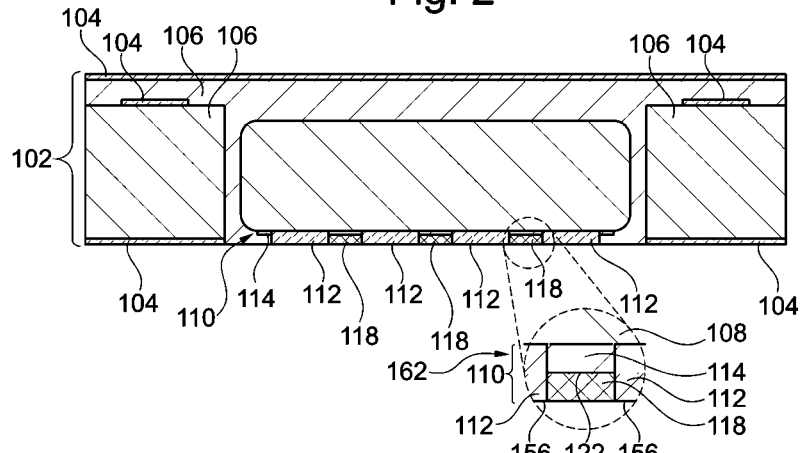

Referring to FIG. 3, the component 108 may have been embedded in the stack 102 and may have been glued in place by lamination.

The structure shown in FIG. 3 may be obtained by laminating one or more further electrically insulating layer structures 106 and one or more further electrically conductive layer structures 104 to the upper main surface of the structure shown in FIG. 2. For instance, a prepreg layer (as further electrically insulating layer structure 106) and a copper foil (as further electrically conductive layer structure 104) may be laminated on top of the structure shown in FIG. 2. During the lamination process, uncured material of the further electrically insulating layer structure 106 may become flowable or melt and may flow in gaps between stack 102, temporary carrier 152 and component 108, including gaps 154 described referring to FIG. 1. Upon curing (for instance cross-linking, polymerizing, etc.) of the material of the further electrically insulating layer structure 106, the filling medium in said gaps (including the gaps 154) may become solid.

In particular, underfill 118 material may be formed in the gaps 154 by said now solidified resin material. This is shown in a detail 162 in FIG. 3. Detail 162 also shows that the bottom area formed by the free end faces 156 of the pads 112 and the bottom surface of the underfill 118 may be aligned and may form a continuous planar surface.

As an alternative to the described lamination, it may also be possible to glue component 108 in place in the cavity 158 formed in stack 102 by filling liquid adhesive material in the gaps in between. Upon curing said adhesive material, the component 108 may be again glued in place in cavity 158.

After having glued the component 108 in place within cavity 158 and thus having provided an integral connection with stack 102, the temporary carrier 152 may be removed. When the temporary carrier 152 is a sticky tape, it may be simply peeled off from the lower main surface of the structure shown in FIG. 3.

As can be seen in FIG. 3, lower main surfaces of the stack 102, of the underfill 118 and of the pads 112 may be at the same vertical level and form a common planar horizontal surface. Thus, their lower end surfaces may be coplanar, aligned and in flush with each other. In contrast to this, end surface 122 of the dielectric material 114 of the redistribution structure 110 may be retracted upwardly and is no longer exposed.

The underfill 118, here an underfilling laminate resin, is provided, inter alia, on the end surface 122 of dielectric material 114 between adjacent pads 112 of the electronic component 108. For instance, the material of the underfill 118 may be any kind of resin, for instance prepreg resin (in particular an epoxy resin), an epoxy derivative (such as Ajinomoto® Build-up Film), etc. Ajinomoto® is a registered mark of Ajinomoto Co., Inc., 15-1, Kyobashi 1-chome, Chuo-ku, Tokyo, Japan.

Figure 4:
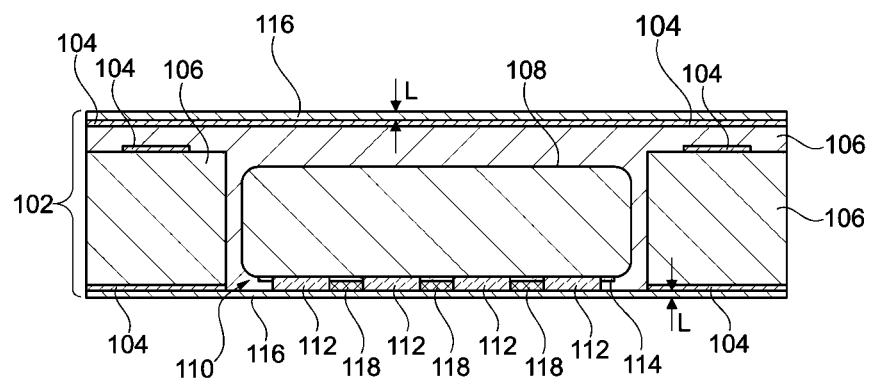

Referring to FIG. 4, electrically conductive material 116, such as copper, may be applied on the entire upper and lower main surfaces of the structure shown in FIG. 3, including the exposed surface of the pads 112 and of the underfill 118. Said electrically conductive material 116 may be applied by electroless deposition followed by galvanic plating. In the shown embodiment, the electrically conductive material 116 may be formed as continuous electrically conductive layers on the top and bottom main surfaces of the structure shown in FIG. 3. In particular, the electrically conductive layer structure 104 arranged on a bottom of the stack 102 may be covered by said electrically conductive material 116. The electrically conductive material 116 may be applied also on underfill 118 on the end surface 122 of the dielectric material 114 between adjacent pads 112 and laterally of the pads 112, as well as on the pads 112.

Figure 5:
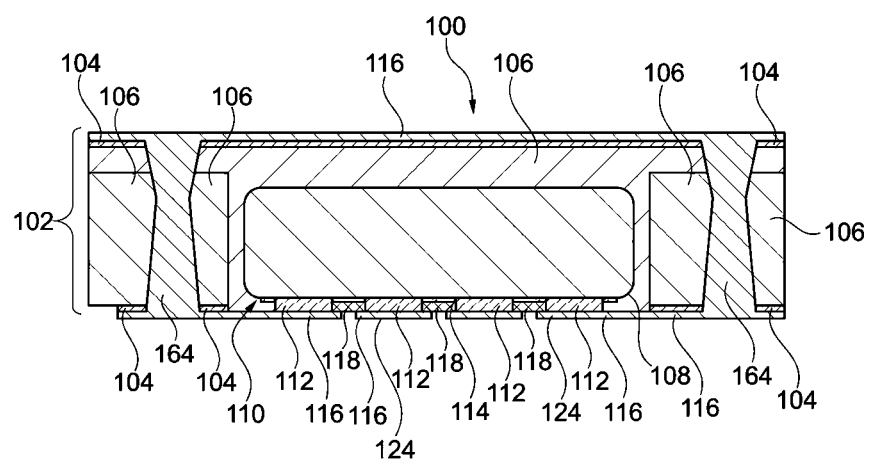

As already mentioned, the electrically conductive material 116 may be formed on both opposing main surfaces of the structure shown in FIG. 3 by electroless deposition. If the copper layer formed as electrically conductive material 116 by electroless plating shall be further thickened, it may be possible to carry out subsequently a galvanic plating process until a desired thickness L of the continuous layer of electrically conductive material 116 may be obtained. The electrically conductive material 116 may be deposited for enabling the formation of desired lateral electric connections, which may be obtained by patterning the latter, as shown in FIG. 5. In other words, subsequent patterning (compare FIG. 5) may enable a circuit designer to freely design laterally electrically conductive connections. Said electric connections may thus be formed by plating, rather than by sputtering (which may be more cumbersome). Since the poorly adhesive polyimide of the dielectric material 114 may be no longer exposed due to its coverage by underfill 118, no adhesion issues may occur when depositing the additional electrically conductive material 118 in particular on the underfill 118 and on the further electrically insulating layer structure 106 (for instance both epoxy resin) used for laminating, as described. Thickness L of the continuous layers of electrically conductive material 116 may be adjusted by adjusting the electroless deposition process (and optionally the galvanic plating process).

Referring to FIG. 5, the electrically conductive material 116 on the lower main surface of FIG. 4 may be patterned (for instance by lithographic etching) to form lands 124 on the pads 112. As can be seen, the lands 124 may extend laterally beyond the respective pad 112. This may enable a circuit designer to laterally extend the electrically conductive connections of component carrier 100 and thereby refine the electric connection.

As shown in FIG. 5 as well, laser through holes have been formed extending vertically through the stack 102. Thereafter, the laser through holes have been filled with an electrically conductive filling medium, such as copper, to thereby form electrically conductive vertical interconnects 164 connecting a front side with a back side of the readily manufactured component carrier 100. By said vertical interconnects 164, i.e. copper filled laser vias, some of the pads 112 may be electrically connected with the opposing main surface of the component carrier 100.

As a result of the described manufacturing process, the shown component carrier 100 according to an exemplary embodiment of the invention may be obtained. This component carrier 100 may comprise stack 102 composed of electrically conductive layer structures 104 and electrically insulating layer structures 106. Component 108 may be embedded in the stack 102. The component 108 may comprise redistribution structure 110 with electrically conductive pads 112 vertically protruding beyond end surface 122 of dielectric material 114 of the redistribution structure 110 by not more than 30 µm. Patterned electrically conductive material 116 may be applied on said pads 112 to thicken them.

Highly advantageously, the electrically conductive material 116 be de-posited by electroless deposition not only on the material of the pads 112, but also on the resin underfill 118 in between. Due to the protrusion of the pads 112 beyond the end surfaces 122 of the dielectric material 114 of the redistribution structure 110, no polyimide surfaces may be exposed when depositing the electrically conductive material 116 so that the formation of the electrically conductive material 116 may also work on the underfill 118 with proper adhesion. As a result, sputtering may be made dispensable for forming electrically conductive material 116. Furthermore, a high reliability and an increased stability of the manufactured component carrier 100 may be achieved.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising: a stack comprising at least one electrically conductive layer structure and/or at least one electrically insulating layer structure; a component embedded in a cavity of the stack; wherein the component comprises a redistribution structure with at least one electrically conductive pad that vertically protrudes; and an electrically conductive material on at least part of said at least one electrically conductive pad, wherein a ratio between a thickness and a diameter of the at least one electrically conductive pad is smaller than 0.5, wherein the at least one electrically conductive pad vertically protrudes beyond an end surface of a dielectric material of the redistribution structure, wherein the at least one electrically conductive pad vertically protrudes beyond the end surface of the dielectric material of the redistribution structure by not more than 30 um, wherein the at least one electrically conductive pad does not extend beyond the cavity.

2. The component carrier according to claim 1, wherein the dielectric material comprises or consists of a non-electroless plateable or poorly electroless plateable material.

3. The component carrier according to claim 1, wherein the electrically conductive material comprises or consists of copper.

4. The component carrier according to claim 1, wherein one of the at least one electrically conductive layer structure is arranged on a bottom of the stack and is at least partially covered by said electrically conductive material.

5. The component carrier according to claim 1, comprising an underfill or an underfilling laminate resin, on the end surface of the dielectric material and between adjacent electrically conductive pads of the component, wherein material of the underfill also surrounds at least part of sidewalls and/or at least part of an upper main surface of the embedded component for mechanically connecting the component with the stack.

6. The component carrier according to claim 1, wherein a thickness of the at least one electrically conductive pad is in a range from 4 µm to 30 µm.

7. The component carrier according to claim 1, wherein a ratio between a thickness and a diameter of the at least one electrically conductive pad is smaller than 0.2.

8. The component carrier according to claim 1, wherein the electrically conductive material is patterned to form at least one land on the at least one electrically conductive pad, or wherein the at least one land extends laterally beyond the at least one electrically conductive pad on at least one side.

9. The component carrier according to claim 1, wherein the electrically conductive material is applied also on an underfill, or is applied on an underfilling laminate resin on the end surface of the dielectric material and between adjacent electrically conductive pads.

10. The component carrier according to claim 1, wherein the electrically conductive material forms part of a patterned metal layer.

11. The component carrier according to claim 1, comprising at least one of the following features:
   wherein the component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip;
   wherein the at least one electrically conductive layer structure comprises at least one of the group consisting of copper, aluminum, nickel, silver, gold, palladium, and tungsten;
   wherein the at least one electrically insulating layer structure comprises at least one of the group consisting of resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
   wherein the component carrier is shaped as a plate;
   wherein the component carrier is configured as one of the group consisting of a printed circuit board, and a substrate;
   wherein the component carrier is configured as a laminate-type component carrier.

12. A method of manufacturing a component carrier, comprising: providing a stack comprising at least one electrically conductive layer structure and/or at least one electrically insulating layer structure; embedding a component in a cavity of the stack; providing the component with a redistribution structure with at least one electrically conductive pad that vertically protrudes; and forming electrically conductive material on at least part of said at least one electrically conductive pad, wherein a ratio between a thickness and a diameter of the at least one electrically conductive pad is smaller than 0.5, wherein the at least one electrically conductive pad vertically protrudes beyond an end surface of a dielectric material of the redistribution structure, wherein the at least one electrically conductive pad vertically protrudes beyond the end surface of the dielectric material of the redistribution structure by not more than 30 um, wherein the at least one electrically conductive pad does not extend beyond the cavity.

13. The method according to claim 12, wherein the method comprises providing the at least one electrically conductive pad so as to vertically protrude beyond an end surface of dielectric material of the redistribution structure.

14. The method according to claim 12, wherein the method comprises applying the electrically conductive material by electroless plating.

15. The method according to claim 13, wherein the method comprises forming the electrically conductive material also on an underfill covering the end surface of the dielectric material between adjacent electrically conductive pads.

16. The method according to claim 12, wherein the method comprises forming the electrically conductive material as a continuous layer.

17. The method according to claim 16, wherein the method comprises subsequently patterning the continuous layer to thereby form at least one land being electrically connected to the at least one electrically conductive pad.

18. The method according to claim 12, wherein the method comprises:

providing the component with a preform of the redistribution structure and a preform of the at least one electrically conductive pad; and selectively thickening the preform of the at least one electrically conductive pad so as to protrude beyond the end surface.

19. A component carrier, comprising: a stack comprising at least one electrically conductive layer structure and/or at least one electrically insulating layer structure; a component embedded in a cavity of the stack; wherein the component comprises a redistribution structure with at least one electrically conductive pad that vertically protrudes; and an electrically conductive material on at least part of said at least one electrically conductive pad, wherein a ratio between a thickness and a diameter of the at least one electrically conductive pad is smaller than 0.5, and wherein the at least one electrically conductive pad vertically protrudes beyond an end surface of a dielectric material of the redistribution structure; wherein the at least one electrically conductive pad does not extend beyond the cavity; the component carrier comprising: an underfill or an underfilling laminate resin, on the end surface of the dielectric material and between adjacent electrically conductive pads of the component, wherein material of the underfill also surrounds at least part of a sidewall and/or at least part of an upper main surface of the embedded component for mechanically connecting the component with the stack.

* * * * *